(12) United States Patent
Aoyagi

(10) Patent No.: US 8,884,439 B2
(45) Date of Patent: Nov. 11, 2014

(54) JOINING ELECTRODE, METHOD OF MANUFACTURING THE SAME, SEMICONDUCTOR DEVICE, AND METHOD OF MANUFACTURING THE SAME

(75) Inventor: Kenichi Aoyagi, Kanagawa (JP)

(73) Assignee: Sony Corporation, Tokyo (JP)

( * ) Notice: Subject to any disclaimer, the term of this patent is extended or adjusted under 35 U.S.C. 154(b) by 276 days.

(21) Appl. No.: 13/352,612

(22) Filed: Jan. 18, 2012

(65) Prior Publication Data

US 2012/0211894 A1 Aug. 23, 2012

(30) Foreign Application Priority Data

Feb. 23, 2011 (JP) .................................. 2011-037417

(51) Int. Cl.
*H01L 23/42* (2006.01)
*H01L 23/00* (2006.01)
*H01L 21/321* (2006.01)

(52) U.S. Cl.
CPC ....... *H01L 24/81* (2013.01); *H01L 2924/01005* (2013.01); *H01L 2224/05624* (2013.01); *H01L 2924/01033* (2013.01); *H01L 2224/03616* (2013.01); *H01L 2924/01074* (2013.01); *H01L 24/05* (2013.01); *H01L 2224/05546* (2013.01); *H01L 2224/05647* (2013.01); *H01L 2924/01013* (2013.01); *H01L 2924/01006* (2013.01); *H01L 21/3212* (2013.01); *H01L 2924/0105* (2013.01); *H01L 2224/05684* (2013.01); *H01L 2224/03462* (2013.01); *H01L 2224/05186* (2013.01); *H01L 2224/05573* (2013.01); *H01L 24/06* (2013.01); *H01L 2224/08148* (2013.01); *H01L 2224/05572* (2013.01); *H01L 2924/01029* (2013.01); *H01L 2924/01073* (2013.01); *H01L 24/03* (2013.01); *H01L 2224/05026* (2013.01); *H01L 2224/05181* (2013.01); *H01L 2224/0345* (2013.01)
USPC .... 257/774; 257/775; 257/776; 257/E21.158; 257/E21.011; 174/250; 438/675; 451/28

(58) Field of Classification Search
CPC ..... H01L 24/81; H01L 21/3212; H01L 24/03; H01L 24/05; H01L 24/06; H01L 2924/01029; H01L 2924/01073; H01L 2924/01005; H01L 2924/01074; H01L 2224/0345
See application file for complete search history.

(56) References Cited

U.S. PATENT DOCUMENTS 6,285,073 B1 * 9/2001 Cooper et al. ................. 257/648
2003/0052409 A1 * 3/2003 Matsuo et al. ................. 257/737

FOREIGN PATENT DOCUMENTS

JP 2006-191081 7/2006

* cited by examiner

*Primary Examiner* — Yasser A Abdelaziez
(74) *Attorney, Agent, or Firm* — Rader, Fishman & Grauer PLLC

(57) ABSTRACT

Disclosed herein is a joining electrode including: an insulating layer; a recessed portion formed in the insulating layer; a covering layer formed on a side surface and a bottom surface of the recessed portion; and a joining metallic layer formed on the covering layer and having an upper surface protruding from a surface of the insulating layer.

5 Claims, 4 Drawing Sheets

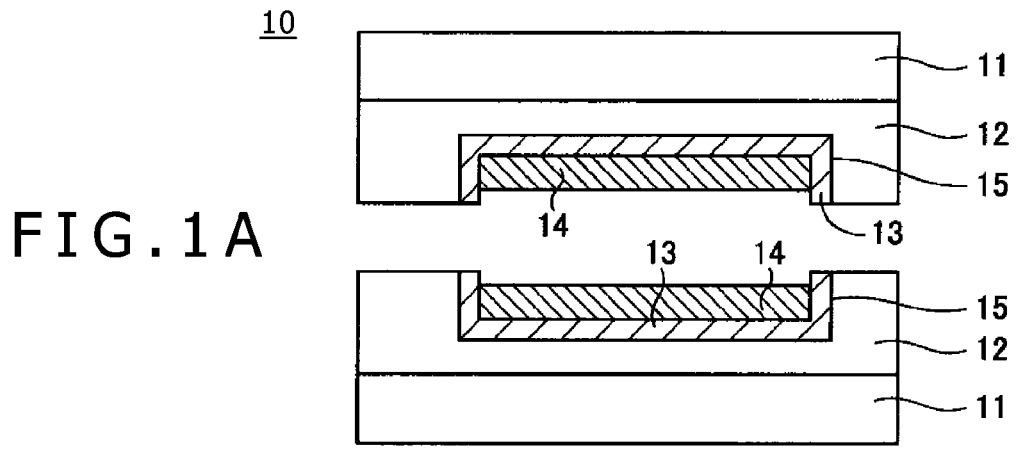
FIG.1A
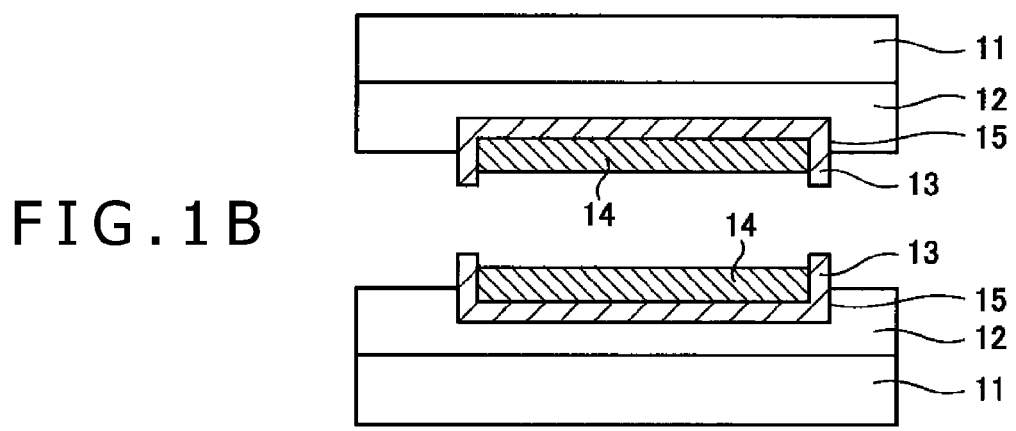
FIG.1B
FIG.2
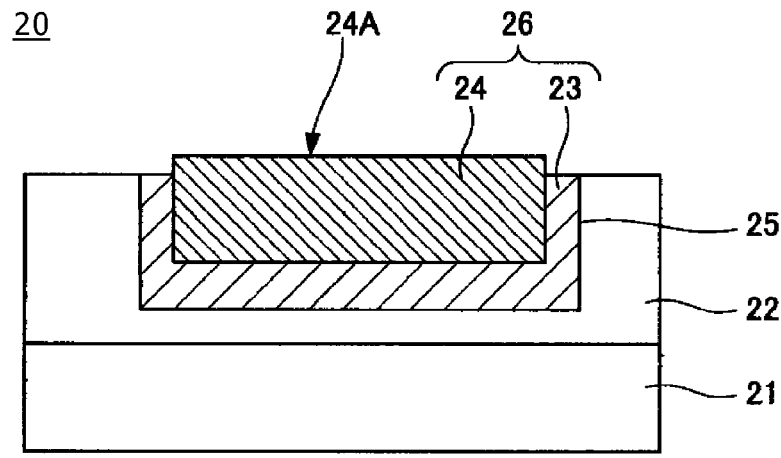

JOINING ELECTRODE, METHOD OF MANUFACTURING THE SAME, SEMICONDUCTOR DEVICE, AND METHOD OF MANUFACTURING THE SAME

BACKGROUND

The present disclosure relates to a joining electrode used for joining between conductive material layers, a method of manufacturing the joining electrode, a semiconductor device including the joining electrode, and a method of manufacturing the semiconductor device including the joining electrode.

In a lamination structure of a semiconductor device or the like, three-dimensional joining of metallic electrodes is carried out. This technique, for example, is disclosed in Japanese Patent Laid-Open No. 2006-191081. In the three-dimensional joining of the metallic electrodes, electrode joining is carried out in which conductive material layers such as electrode pads or plugs are made to come into contact with each other to be electrically connected to each other.

SUMMARY

In the electrode joining described above, enhancement of connection reliability is required.

There is provided a joining electrode having high connection reliability.

According to an embodiment of the present disclosure, there is provided a joining electrode including: an insulating layer; a recessed portion formed in the insulating layer; a covering layer formed on a side surface and a bottom surface of the recessed portion; and a joining metallic layer formed on the covering layer and having an upper surface protruding from a surface of the insulating layer.

According to another embodiment of the present disclosure, there is provided a semiconductor device including: a semiconductor substrate; an insulating layer formed on the semiconductor substrate; a recessed portion formed in the insulating layer; a covering layer formed on a side surface and a bottom surface of the recessed portion; and a joining metallic layer formed on the covering layer and having an upper surface protruding from a surface of the insulating layer.

According to still another embodiment of the present disclosure, there is provided a method of manufacturing a joining electrode including: forming a recessed portion in an insulating layer; forming a covering layer on a surface of the insulating layer, and a side surface and a bottom surface within the recessed portion; forming a joining metallic layer on the covering layer; and polishing to remove the covering layer from the surface of the insulating layer so as to protrude an upper surface of the joining metallic layer from the surface of the insulating layer.

According to yet another embodiment of the present disclosure, there is provided a method of manufacturing a semiconductor device including: forming an insulating layer on a semiconductor substrate; forming a covering layer on a surface of the insulating layer, and a side surface and a bottom surface within a recessed portion; forming a joining metallic layer on the covering layer; and polishing to remove the covering layer from the surface of the insulating layer so as to protrude an upper surface of the joining metallic layer from the surface of the insulating layer.

According to the joining electrode and the semiconductor device of the embodiment and another embodiment of the present disclosure, the joining metallic layer having the upper surface protruding from the surface of the insulating layer is provided, thereby making it possible to enhance the connection reliability.

According to the method of manufacturing the joining electrode, and the method of manufacturing the semiconductor device of still and yet another embodiment of the present disclosure, it is possible to form the projected shaped joining metallic layer which is capable of enhancing the connection reliability.

As set forth hereinabove, according to the present disclosure, it is possible to enhance the connection reliability of the joining electrode.

BRIEF DESCRIPTION OF THE DRAWINGS

FIGS. 1A and 1B are respectively cross sectional views showing a structure of a joining electrode;

FIG. 2 is a cross sectional view showing a structure of an embodiment of a semiconductor device including a joining electrode according to the present disclosure;

DETAILED DESCRIPTION OF THE PREFERRED EMBODIMENTS

Figure 3:
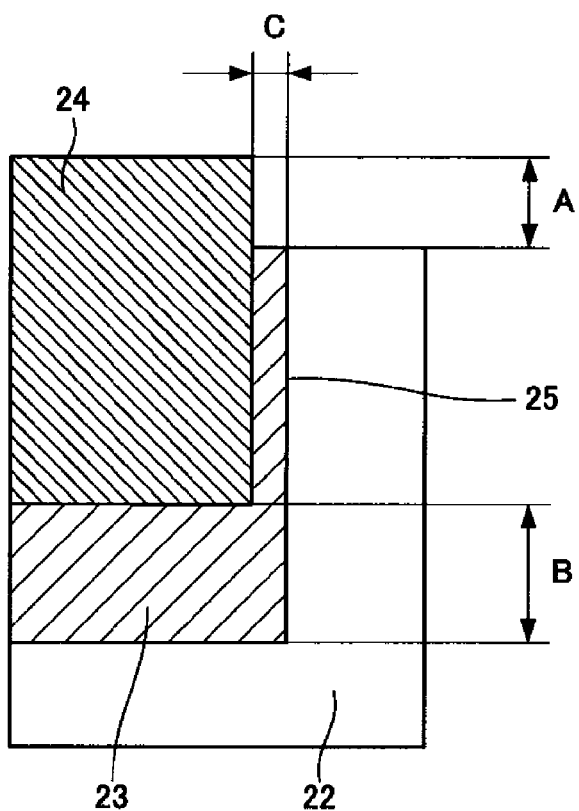
FIG. 3 is a partial cross sectional view showing the structure of the embodiment of the semiconductor device including the joining electrode according to the present disclosure.

Embodiments of the present disclosure will be described in detail hereinafter. However, the present disclosure is not limited thereto.

It is noted that the description will be given below in accordance with the following order:

1. Outline of Joining Electrode;
2. Embodiments of Joining Electrode and Semiconductor Device; and
3. Embodiments of Method of Manufacturing Joining Electrode, and Method of Manufacturing Semiconductor Device.

1. Outline of Joining Electrode

A description will be given below with respect to a method of joining an electrode in three-dimensional mounting.

FIG. 1A shows a structure of a joining electrode. The joining electrode 10 is composed of an insulating layer 12, and a barrier metal layer 13 and a joining metallic layer 14. In this case, the insulating layer 12 is formed on a substrate 11. Also, the barrier metal layer 13 and the joining metallic layer 14 are both formed within a recessed portion 15 of the insulating layer 12.

The joining electrode 10 is generally formed by utilizing a damascene method using a Chemical Mechanical Polishing (CMP) method. Firstly, the insulating layer 12 is formed on the substrate 11. Also, the recessed portion 15 for formation of the joining metallic layer 14 becoming an electrode is formed in the insulating layer 12. The barrier metal layer 13 is formed by, for example, utilizing either a sputtering method or a plating method so as to cover the entire surface of the insulating layer 12 including an inner surface of the recessed portion 15.

Also, the joining metallic layer 14 is formed on the barrier metal layer 13. At this time, a stepped portion of the recessed portion 15 is filled with the joining metallic layer 14.

Next, the excessive joining metallic layer 14 and barrier metal layer 13 which are formed on the insulating layer 12 are removed by utilizing the CMP method. The barrier metal layer 13 and the joining metallic layer 14 remain within the recessed portion 15 through the removal. The barrier metal layer 13 and the joining metallic layer 14 which remain within the recessed portion 15 of the insulating layer 12 become a joining electrode.

However, in the general CMP method, like the joining metallic layer 14 shown in FIG. 1A, an upper surface of the joining metallic layer 14 backs away from a surface of the insulating layer 12 due to a phenomenon called a dishing. For this reason, as shown in FIG. 1A, when the joining metallic layers 14 whose connection surfaces backs away from the surface of the insulating layer 12 are made to come into contact with each other, a cavity is defined between the joining metallic layers 14. As a result, the connection reliability of the joining electrode is reduced.

In addition, a method of causing the insulating layer 12 in the circumference of the joining metallic layer 14 to backs away from the surface of the insulating layer 12, as shown in FIG. 1B, is expected as a connection method for electrodes each of whose upper surface backs away from the surface of the insulating layer due to the dishing. With regard to a method of causing the insulating layer 12 to back, for example, after the joining metallic layer 14 is planarized by utilizing the CMP method, the removal of the surface of the insulating layer 12 is carried out by utilizing either a dry etching method or a wet etching method.

However, when a material, such as Cu, which is easy to diffuse into the insulating layer 12 is contained in the material of the joining metallic layer 14, it is necessary to provide the barrier metal layer 13 between the insulating layer 12 and the joining metallic layer 14. For this reason, even when as shown in FIG. 1B, the insulating layer 12 in the circumference of the joining metallic layer 14 is caused to back, the barrier metal layer 13 remains on a sidewall of the joining metallic layer 14.

In addition, normally, a chemically inactive metal such as a tantalum system metal is contained in the barrier metal layer 13. The barrier metal layer 13 is difficult to etch at the same rate as that of the insulating layer 12 in a process for causing the insulating layer 12 to back by utilizing either the dry etching method or the wet etching method. For this reason, a depression of the barrier metal layer 13 caused by the excessive etching, or the worsening of the roughness of the surface of the joining electrode is caused in a process for removing the insulating layer 12.

As described above, in the method of forming the joining electrode by utilizing the existing CMP method, the depression of the upper surface of the joining metallic layer 14 due to the dishing reduces the connection reliability.

For obtaining the electrode joining having the high reliability by using the joining metallic layer 14 having the upper surface in which the depression is formed, preferably, the joining metallic layer 14 becoming the electrode joining portion is formed so as to protrude more than the insulating layer 12 and the barrier metal layer 13.

2. Embodiments of Joining Electrode and Semiconductor Device

Hereinafter, a description will be given with respect to embodiments of a joining electrode and a semiconductor device including the joining electrode.

FIG. 2 is a cross sectional view showing a schematic structure of the embodiment of the semiconductor device including the joining electrode.

The semiconductor device 20 shown in FIG. 2 includes a semiconductor substrate 21, and an insulating layer 22 formed on the semiconductor substrate 21. In addition, a recessed portion 25 which is a wiring trench for formation of a joining electrode is formed in the insulating layer 22. Also, a joining electrode 26 is formed within the recessed portion 25. The joining electrode 26 is composed of a covering layer 23 and a joining metallic layer 24. In this case, the covering layer 23 is formed on a bottom surface and a side surface of the recessed portion 25. The joining metallic layer 24 is formed on the covering layer 23.

The covering layer 23 formed on the bottom surface and the side surface of the recessed portion 25 of the insulating layer 22, for example, is composed of a barrier metal layer and a sacrifice polishing layer. A material which is low in a property of diffusion into an insulating layer, and of which a fine layer can be made is used as each of the barrier metal layer and the sacrifice polishing layer. In addition, a material which shows a sufficient difference in etching rate in the CMP process is used. For example, TiN, TaN, Ta or the like is used. The barrier metal layer is formed in order to prevent the joining metallic layer 24 from diffusing into the insulating layer 22, and to ensure a thickness of a covering layer in a polishing process to be described later. In addition, the sacrifice polishing layer can also be formed in order to ensure the thickness of the covering layer in the polishing process to be described later without taking the diffusion of the joining metallic layer 24 into the insulating layer 22 into consideration.

An upper surface 24A of the joining metallic layer 24 formed within the recessed portion 25 is formed at a position higher than the surface of the insulating layer 22, and the upper surface of the covering layer 23 formed on the side surface of the recessed portion 25. That is, the joining metallic layer 24 is formed so as to have a shape (projected shape) protruding from the surface of the insulating layer 22.

The joining metallic layer 24, for example, is made of Cu, Al, W or the like.

FIG. 3 shows a relationship between the thickness of the covering layer 23 formed on the bottom surface and the side surface of the recessed portion 25 of the insulating layer 22, and the height of the joining metallic layer 24. In FIG. 3, a protrusion height (protrusion amount) of the joining metallic layer 24 from the surface of the insulating layer 22 is designated by reference symbol A. In addition, the thickness of the covering layer 23 formed on the bottom surface of the recessed portion 25 is designated by reference symbol B, and the thickness of the covering layer 23 formed on the side surface of the recessed portion 25 is designated by reference symbol C.

The protrusion amount A of the joining metallic layer 24 from the surface of the insulating layer 22 is formed equal to or smaller than the thickness B (A≤B) of the covering layer 23 formed on the bottom surface of the recessed portion 25. In addition, the protrusion amount A of the joining metallic layer 24 from the surface of the insulating layer 22 is formed larger than the thickness C (A>C) of the covering layer 23 formed on the side surface of the recessed portion 25.

The protrusion amount A of the joining metallic layer 24 comes to have the thickness which is comparable with the thickness B of the covering layer 23 formed on the bottom surface of the recessed portion 25, or smaller than the thickness B of the covering layer 23 depending on conditions of a manufacturing method to be described later. For example, the protrusion amount A of the joining metallic layer 24 is ½ or more of the thickness B of the covering layer 23, and more preferably ⅔ or more of the thickness B of the covering layer 23.

In addition, the thickness C of the covering layer 23 on the side surface of the recessed portion 25 is preferably equal to or smaller than the thickness B of the covering layer 23 on the bottom surface of the recessed portion 25 (C≤B). As described above, the thickness B of the covering layer 23 on the bottom surface of the recessed portion 25 is formed so as to be comparable with or larger than the protrusion amount A depending on the protrusion amount A of the joining metallic layer 24. For this reason, when the covering layer 23 within the recessed portion 25 is formed so as to have the same thickness on the side surface and the bottom surface of the recessed portion 25, the thickness C of the covering layer 23 on the side surface of the recessed portion 25 is formed thickly more than necessary in some cases.

All it takes is that the thickness C of the covering layer 23 on the side surface of the recessed portion 25 is a thickness with which the covering layer 23 functions as the barrier layer between the joining metallic layer 24 and the insulating layer 22 without depending on the size of the protrusion amount A. For this reason, the thickness C of the covering layer 23 on the side surface of the recessed portion 25 may be smaller than the thickness B of the covering layer 23 on the bottom surface of the recessed portion 25. For example, the thickness C of the covering layer 23 on the side surface of the recessed portion 25 is preferably ½ or less of the thickness B of the covering layer 23 on the bottom surface of the recessed portion 25, and more preferably ⅓ or less of the thickness B of the covering layer 23. Likewise, the thickness C of the covering layer 23 on the side surface of the recessed portion 25 is preferably ½ or less of the protrusion amount A of the joining metallic layer 24 from the surface of the insulating layer 22, and more preferably ⅓ or less of the protrusion amount A of the joining metallic layer 24 from the surface of the insulating layer 22.

The reducing of the thickness C of the covering layer 23 on the side surface of the recessed portion 25 makes it possible to increase a formation area of the joining metallic layer 24 within the wiring trench (the recessed portion 25).

In addition, the reducing of the thickness C of the covering layer 23 on the side surface of the recessed portion 25 makes it possible to prevent the removal of the covering layer 23 when the surfaces of the insulating layer 22 and the joining metallic layer 24 are planarized.

When the covering layer 23 is removed from the side surface of the recessed portion 25, a stepped portion is formed between the insulating layer 22 and the covering layer 23. In a polishing process, a residual component such as a slurry or polishing scrap is easy to pile up in the stepped portion. In addition, since the covering layer 23 is thinly formed, the stepped portion is narrow and thus it is difficult to remove the residual component by carrying out the cleaning. The remaining of the residual component may cause the reduction of the wiring reliability due to the corrosion and the degassing of the conductive material layer.

Therefore, the reducing of the thickness C of the covering layer 23 on the side surface of the recessed portion 25 makes it possible to suppress the generation of the stepped portion between the insulating layer 22 and the covering layer 23, thereby enhancing the reliability of the joining electrode.

By using the joining electrode 26 having the structure described above, for example, as shown in FIG. 4, it is possible to join a semiconductor device 20.

The joining of the joining electrode 26 results in that semiconductor substrates 21 can be electrically connected to each other through the joining electrode 26. In addition, both of the insulating layer 22 and joining electrode 26 described above are formed on a non-joining surface side of the semiconductor substrate 21, and the semiconductor substrates 21 are joined to each other by using the joining electrode 26 thus formed, thereby making it possible to manufacture the semiconductor device having the lamination structure.

A cavity defined between the insulating layers 22 after completion of the joining may be filled with an underfill resin.

It is noted that although in the embodiment of the semiconductor device 20 described above, the recessed portion 25 of the insulating layer 22 formed on the semiconductor substrate 21 is used as the wiring trench in which the joining electrode 26 is formed, the position where the joining electrode 26 is formed is not limited as long as that is a trench formed in the insulating layer. The joining electrode composed of the covering layer and joining metallic layer described above can be formed either in an interlayer insulating layer formed on the semiconductor substrate, or within a recessed portion formed in an insulating substrate or the like. In addition, a trench or a hole portion is formed in a semiconductor substrate or the like, and then an insulating layer, and a covering layer and a joining metallic layer are formed in the trench or the hole portion, thereby obtaining the joining electrode.

3. Embodiments of Method of Manufacturing Joining Electrode, and Method of Manufacturing Semiconductor Device Next, a description will be given with respect to embodiments of a method of manufacturing the joining electrode, and a method of manufacturing the semiconductor device including the joining electrode.

Figure 5A:
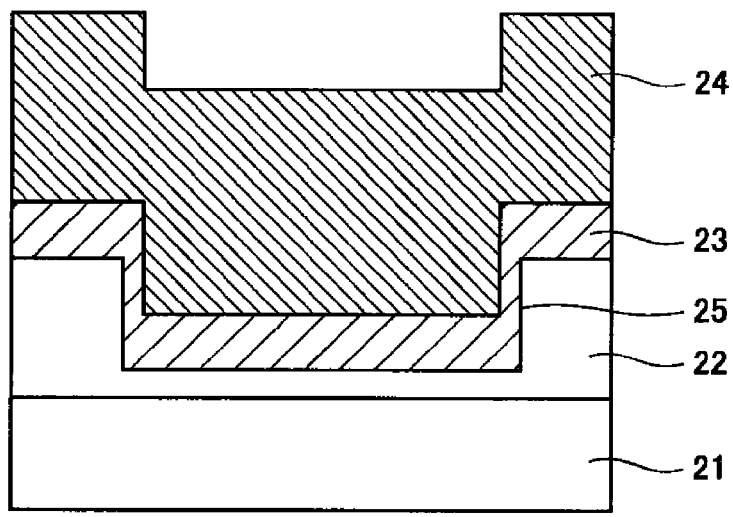
FIGS. 5A to 5C are respectively cross sectional views explaining an embodiment of a method of manufacturing the semiconductor device including the joining electrode according to the present disclosure.

Firstly, as shown in FIG. 5A, the insulating layer 23, the covering layer 23, and the joining metallic layer 24 are formed in this order on the semiconductor substrate 21.

The insulating layer 22 is formed on the semiconductor substrate 21 by utilizing a known method such as a CVD method or a sputtering method. After completion of the formation of the insulating layer 22, the recessed portion 25 is formed in the insulating layer 22 of a portion in which the joining electrode is intended to be formed. That is, a pattern in which the position of formation of the recessed portion 25 is opened is formed on the insulating layer 22 by utilizing a photolithography method. Also, the insulating layer 22 is selectively etched away to form the recessed portion 25.

In a process for forming the covering layer 23 on the insulating layer 22, the covering layer 23 is formed on the surface of the insulating layer 22, the bottom surface of the recessed portion 25, and the side surface of the recessed portion 25. For formation of the covering layer 23, the barrier metal layer or a sacrifice polishing layer may be singularly formed, or a structure may also be adopted in which the sacrifice polishing layer is formed on the barrier metal layer. The covering layer 23, for example, is formed by utilizing a normal reactive sputtering method using a Ti or Ta target and $N_2$ plasma.

In a process for forming the covering layer 23 on the insulating layer 22, the thickness of the covering layer 23 on the surface of the insulating layer 22 is formed equal to or larger than the height (protrusion amount) by which the joining metallic layer 24 protrudes from the surface of the insulating layer 22 in the manufactured joining electrode. In addition, the covering layer 23 having the thickness whose level is equal to that of the surface of the insulating layer 22 is formed on the bottom surface of the recessed portion 25 in the insulating layer 22 by utilizing a formation method such as the sputtering method described above. Moreover, a deposition amount of the covering layer 23 to the side surface of the recessed portion 25 is more reduced than that to each of the bottom surface and the surface of the recessed portion 25. As a result, the covering layer 23 which is thinner than that on the bottom surface of the recessed portion 25 is formed on the side surface of the recessed portion 25.

As described above, for making the thickness level of the covering layer 23 on the surface of the insulating layer 22 equal to that of the bottom surface of the recessed portion 25, and reducing the thickness of the covering layer 23 only on the side surface of the recessed portion 25, the covering layer 23 is formed by utilizing the sputtering method under the condition in which a sputtering effect is low. With regard to the condition in which the sputtering effect is low, for example, preferably, the covering layer 23 is formed under the condition in which a bias power is set at 300 W or less. In addition, when the covering layer 23, for example, is made of tantalum, the covering layer 23 is formed under the condition in which a gas flow rate of Ar is 10 sccm, a gas pressure of Ar is 0.1 Pa or less, a direct-current (DC) power for a target is 10 kW, and a substrate high frequency bias power is 300 W.

In a process for forming the joining metallic layer 24, for example, after a plating seed layer has been formed on the covering layer 23 by utilizing the sputtering method, the joining metallic layer 24 is formed by utilizing an electrolytic plating method. The joining metallic layer 24 is formed so as to have the thickness greater than that enough to be filled in the stepped portion of the recessed portion 25 between the covering layer 23 and the insulating layer 22. The joining metallic layer 24, for example, is made of Cu, Al, W or the like.

Figure 5B:
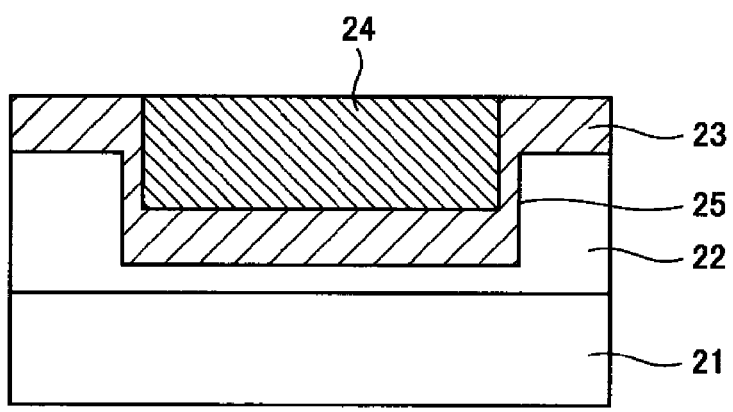

Next, as shown in FIG. 5B, the joining metallic layer 24 is removed until the surface of the covering layer 23 is exposed. The removal of the joining metallic layer 24 is carried out under the condition in which the joining metallic layer 24 can be selectively polished by utilizing the CMP method. For example, the polishing is carried out under the condition in which a polishing rate of the joining metallic layer 24 is 100 times or more, preferably 200 times or more as large as that of the covering layer 23. In such a way, the removal of the joining metallic layer 24 is carried out under the condition in which the polishing rate of the joining metallic layer 24 is sufficiently high with respect to that of the covering layer 23.

If there is a sufficient difference in polishing rate between the covering layer 23 and the joining metallic layer 24, the removal amount of the covering layer 23 can be suppressed in the above polishing process for the joining metallic layer 24. Also, the suppression of the removal amount of the covering layer 23 results in that the thickness of the covering layer 23 formed on the surface of the insulating layer 22 is held. For this reason, in the polishing process for the joining metallic layer 24, the covering layer 23 formed on the surface of the insulating layer 22 is used as an etching stopper, and thus the position of the upper surface of the joining metallic layer 24 can be made flush with the surface of the covering layer 23.

Figure 5C:
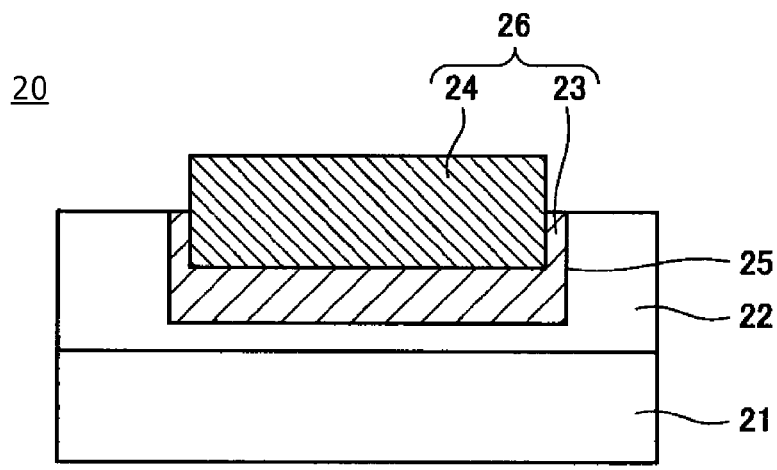

Next, as shown in FIG. 5C, the covering layer 23 on the insulating layer 22 is polished. The removal of the covering layer 23 is carried out under the condition in which the polishing rate of the covering layer 23 is sufficiently high with respect to that of the joining metallic layer 24 by utilizing the CMP method. For example, the polishing is carried out under the condition in which the polishing rate of the joining metallic layer 24 with respect to that of the covering layer 23 is ½ or less, and preferably ⅓ or less.

In the polishing process for the covering layer 23, the polishing rate for the covering layer 23 is increased, whereby the covering layer 23 on the surface of the insulating layer 22 can be removed while the thickness of the joining metallic layer 24 is held. As a result, the thickness of the joining metallic layer 24 is maintained, and thus the shape is obtained in which the upper surface of the joining metallic layer 24 protrudes from the surface of the insulating layer 22.

In addition, in the polishing process for the covering layer 23, if the joining metallic layer 24 is not removed, the height (protrusion amount) of the protrusion of the upper surface of the joining metallic layer 24 is equal to the thickness of the covering layer 23 which is formed on the surface of the insulating layer 22 before the polishing process. Alternatively, the covering layer 23 formed on the surface of the insulating layer 22, and the covering layer 23 formed on the bottom surface of the recessed portion 25 in the insulating layer 22 are formed so as to have the same thickness. For this reason, for example, if the polishing rate for the joining metallic layer 24 with respect to that of the covering layer 23 is ½ or less, the protrusion amount of the joining metallic layer 24 remains by ½ or more of the thickness of the covering layer 23 formed on the bottom surface of the recessed portion 25 in the insulating layer 22. In addition, for example, if the polishing rate for the joining metallic layer 24 with respect to that of the covering layer 23 is ⅓ or less, the protrusion amount of the joining metallic layer 24 remains by ⅔ or more of the thickness of the covering layer 23 formed on the bottom surface of the recessed portion 25 in the insulating layer 22.

In such a way, the protrusion amount of the joining metallic layer 24 can be controlled based on the thickness of the covering layer 23 on the surface of the insulating layer 22 described above, and a ratio of the polishing rate between the covering layer 23 and the joining metallic layer 24 in the polishing process for the covering layer 23.

A description will now be given with respect to a method of selective polishing in the above polishing process for the joining metallic layer 24, and the above polishing process for the covering layer 23.

The selective polishing for the joining metallic layer 24 in the polishing process for the joining metallic layer 24, for example, is carried out by utilizing the CMP method using either an oxidizing agent or a complex forming agent. The using of either the oxidizing agent or the complex forming agent results in that oxidation of the metal composing the joining metallic layer 24 can be facilitated, and the polishing rate for the joining metallic layer 24 with respect to that of the covering layer 23 can be increased.

The selective polishing for the covering layer 23 in the polishing process for the covering layer 23 is adjusted so as to obtain an arbitrary selection ratio by combining a method of suppressing the polishing rate for the joining metallic layer 24, and a method of increasing the polishing rate for the covering layer 23 with each other.

The suppression of the polishing rate for the joining metallic layer 24, for example, is carried out by addition of an oxidation suppressing agent and an anti-oxidizing agent. The adding of the oxidation suppressing agent and the anti-oxidizing agent makes it possible to decrease the polishing rate for the joining metallic layer 24.

In addition, in general, the material used in the covering layer 23 is more inactive than the joining metallic layer 24. For this reason, a concentration of the abrading agent is increased to enhance a mechanical operation, thereby increasing the polishing rate for the covering layer 23.

At this time, pH adjustment for the slurry, surface reforming of the abrading agent, and the like are carried out, whereby an interaction between the abrading agent and the surface of the covering layer 23 can be increased, and thus the mechanical polishing can be more effectively carried out. This method depends on a kind of material of the covering layer 23, and the abrading agent used. For example, for general tantalum composing the covering layer 23, silica particles each having a large specific surface area are dispersed into an acid aqueous solution, thereby obtaining the high polishing rate. At this time, if the oxidizing agent for the metal composing the joining metallic layer 24, for example, a chemical for facilitating the Cu oxidation is not contained, it is possible to suppress the polishing of the joining metallic layer 24.

As described above, as a first stage, the joining metallic layer 24 is selectively removed, and the polishing is carried out until the upper surface of the joining metallic layer 24 becomes flush with the surface of the covering layer 23. Also, as a second stage, the covering layer 23 is preferentially removed, and the covering layer 23 on the surface of the insulating layer 22 is removed in a state in which the thickness of the joining metallic layer 24 is maintained. As a result, as shown in FIG. 5C, the joining electrode 26 can be formed in which the joining metallic layer 24 protrudes from the surface of the insulating layer 22.

Figure 6A:
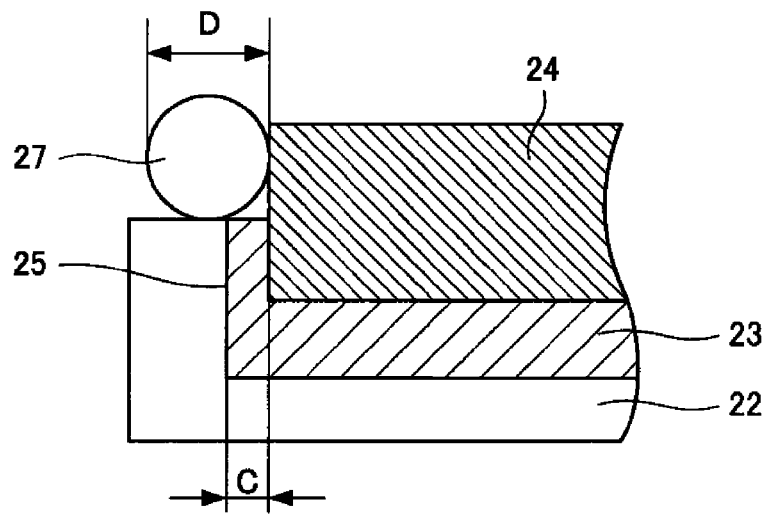
FIGS. 6A to 6C are respectively partial cross sectional views each explaining a relationship between a covering layer and an abrading agent.

In addition, in the polishing process for the covering layer 23, for the abrading agent used in the CMP method, as shown in FIG. 6A, a particle diameter D of an abrading agent 27 is preferably equal to or larger than the thickness C of the covering layer 23 formed on the side surface of the recessed portion 25. In addition, when the abrading agent 27 does not have a spherical shape, but has the major axis and the minor axis existing therein like an elliptic body, the minor axis is preferably equal to or larger than the thickness C of the covering layer 23 formed on the side surface of the recessed portion 25. In particular, preferably, either the particle diameter or the minor axis of the abrading agent 27 is ½ or less of the thickness C of the covering layer 23 formed on the sidewall of the recessed portion 25.

Figure 6B:
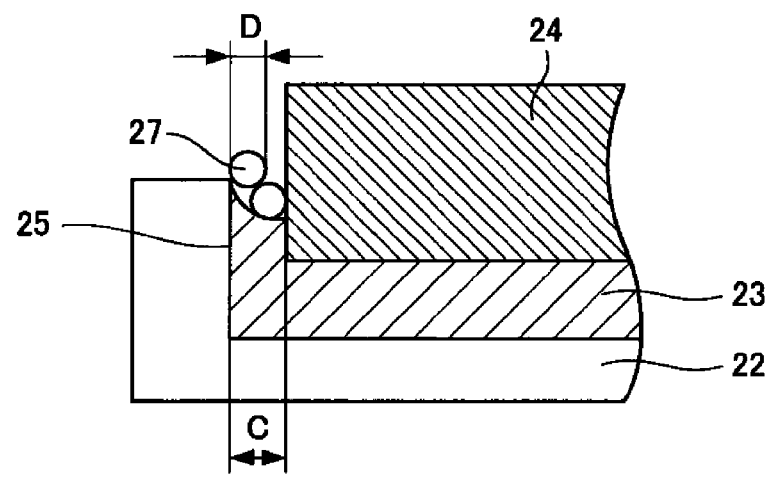

For example, when as shown in FIG. 6B, the particle diameter D of the abrading agent 27 is smaller than the thickness C of the covering layer 23 formed on the side surface of the recessed portion 25, the covering layer 23 within the recessed portion 25 is polished after the surface of the insulating layer 22 has been exposed. When the polishing is continuously carried out in this state, the covering layer 23 is removed to the deep portion in the recessed portion 25.

Figure 6C:
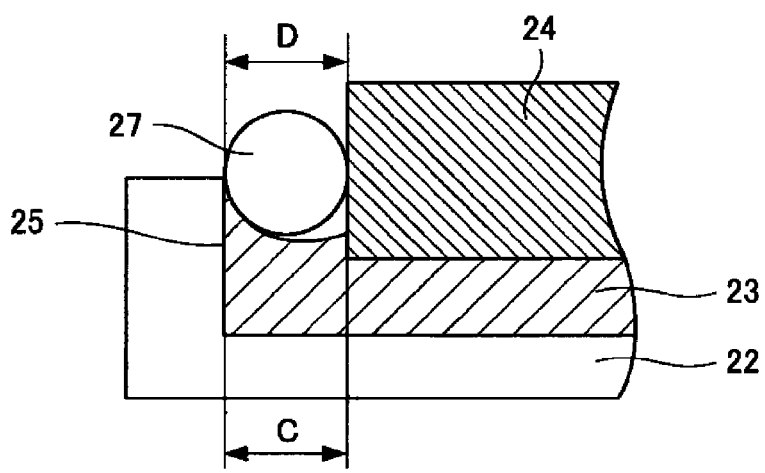

On the other hand, when as shown in FIG. 6C, the particle diameter D of the abrading agent 27 is equal to or larger than the thickness C of the covering layer 23 formed on the side surface of the recessed portion 25, the polishing does not proceed to the deep portion of the covering layer 23 though the surface of the covering layer 23 on the side surface of the recessed portion 25 is polished. For this reason, the covering layer 23 remains on the side surface of the recessed portion 25. The covering layer 23 remains between the insulating layer 22 and the joining metallic layer 24, whereby the joining metallic layer 24 is prevented from diffusing into the insulating layer 22, thereby enhancing the reliability of the joining electrode.

In addition, when the covering layer 23 on the side surface of the recessed portion 25 is selectively polished in the polishing process, the slurry component and the polishing scrap are easy to pile up in the depression of the covering layer 23, formed by the polishing. In such a steep depression, it is difficult to carry out the cleaning to the inside. Thus, the remaining component described above causes the deterioration of the wiring reliability due to the wiring corrosion and the degassing. For this reason, the particle diameter D of the abrading agent 27 is made equal to or larger than the thickness C of the covering layer 23 formed on the side surface of the recessed portion 25, whereby it is possible to prevent the reduction of the reliability due to the removal of the covering layer 23 on the side surface of the recessed portion 25.

According to the embodiment of the method of manufacturing the joining electrode described above, the joining electrode 26 having the projection-like shape is formed in the process for selectively polishing the joining metallic layer 24 after the covering layer 23 and the joining metallic layer 24 have been formed on the insulating layer 22, and the process for preferentially polishing the covering layer 23. Even when the joining metallic layer surface is reduced by the dishing, the contact can be reliably carried out because the joining metallic layer itself is formed so as to have the projection-like shape. Therefore, it is possible to enhance the reliability of the electrode joining.

Figure 4:
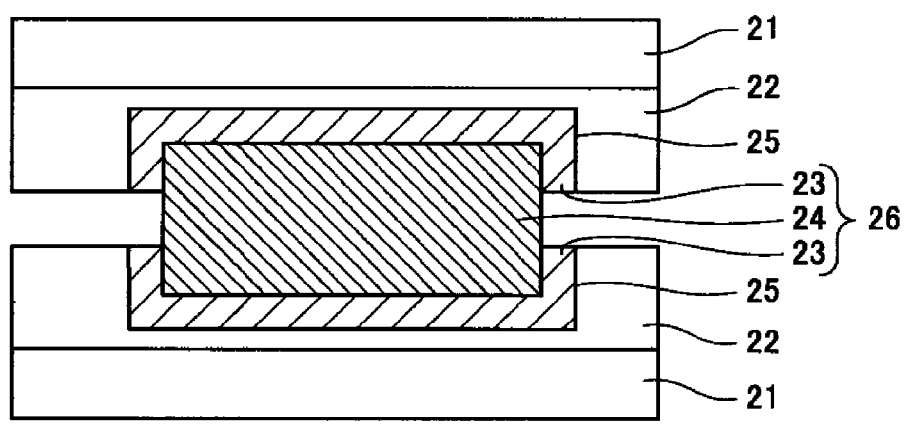
FIG. 4 is a cross sectional view showing the structure of the embodiment of the semiconductor device including the joining electrode according to the present disclosure.

In addition, in the process for selectively polishing the joining metallic layer 24, the upper surface of the joining metallic layer 24 is made flush with the surface of the covering layer 23. Also, in the process for preferentially polishing the covering layer 23, an arbitrary rate ratio is made between the polishing rate for the covering layer 23, and the polishing rate for the joining metallic layer 24, whereby the joining metallic layer 24 can be processed into the shape protruding from the surface of the insulating layer 22 without the remaining of the covering layer 23 on the insulating layer 22. Also, the semiconductor device 20 is joined in the manner as shown in FIG. 4 by using the joining electrode 26 described above, thereby making the electrode joining having the high connection reliability possible.

Other Constitutions

It is noted that the present disclosure can also adopt the following constitutions.

(1) A joining electrode including: an insulating layer; a recessed portion formed in the insulating layer; a covering layer formed on a side surface and a bottom surface of the recessed portion; and a joining metallic layer formed on the covering layer and having an upper surface protruding from a surface of the insulating layer.

(2) The joining electrode described in the paragraph (1), in which a height of protrusion of the upper surface of the joining metallic layer is larger than a thickness of the covering layer formed on the side surface of the recessed portion.

(3) The joining electrode described in the paragraph (1) or (2), in which the covering layer formed on the side surface of the recessed portion is formed so as to have a thickness equal to or larger than a height of protrusion of the upper surface of the joining metallic layer.

(4) The joining electrode described in any one of the paragraphs (1) to (3), in which a thickness of the covering layer formed on the side surface of the recessed portion is smaller than a thickness of the covering layer formed on the bottom surface of the recessed portion.

(5) A semiconductor device including: a semiconductor substrate; an insulating layer formed on the semiconductor substrate; a recessed portion formed in the insulating layer; a covering layer formed on a side surface and a bottom surface of the recessed portion; and a joining metallic layer formed on the covering layer and having an upper surface protruding from a surface of the insulating layer.

(6) A method of manufacturing a joining electrode including: forming a recessed portion in an insulating layer; forming a covering layer on a surface of the insulating layer, and a side surface and a bottom surface within the recessed portion; forming a joining metallic layer on the covering layer; and polishing to remove the covering layer from the surface of the insulating layer so as to protrude an upper surface of the joining metallic layer from the surface of the insulating layer.

(7) The method of manufacturing the joining electrode described in the paragraph (6), in which the polishing includes first polishing in which the joining metallic layer is removed until a surface of the covering layer is exposed, and second polishing in which the covering layer thus exposed in the first polishing is removed until the surface of the insulating layer is exposed.

(8) The method of manufacturing the joining electrode described in the paragraph (6) or (7), in which in the second polishing, the polishing is carried out under a condition in which a polishing rate for the covering layer is larger than that for the joining metallic layer.

(9) The method of manufacturing the joining electrode described in any one of the paragraphs (6) to (8), in which in the first polishing, the polishing is carried out under a condition in which the joining metallic layer is selectively polished.

(10) The method of manufacturing the joining electrode described in any one of the paragraphs (6) to (9), in which in the second polishing, an abrading agent having a particle diameter equal to or larger than a thickness of the covering layer formed on the side surface of the recessed portion is used.

(11) A method of manufacturing a semiconductor device including: forming an insulating layer on a semiconductor substrate; forming a covering layer on a surface of the insulating layer, and a side surface and a bottom surface within a recessed portion; forming a joining metallic layer on the covering layer; and polishing to remove the covering layer from the surface of the insulating layer so as to protrude an upper surface of the joining metallic layer from the surface of the insulating layer.

The present disclosure contains subject matter related to that disclosed in Japanese Priority Patent Application JP 2011-037417 filed in the Japan Patent Office on Feb. 23, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A joining electrode comprising:
   a trench extending partially into an insulating layer and terminating in said insulating layer, said trench having a bottom surface and an upper surface;
   a metallic covering layer lining a side surface of the trench and said bottom surface of the trench, said metallic covering layer forming a basin;
   a joining metallic layer filling said basin and having a protruded surface;
   wherein the metallic covering layer lining the side surface of the trench is partially recessed below the upper surface of the trench and the protruded surface of the joining metallic layer, thereby forming a cavity between the joining metallic layer and said side surface of the trench.

2. The joining electrode according to claim 1, wherein said protruded surface of the joining metallic layer protrudes from within said basin, said cavity being below the upper surface of the trench and the upper surface of the joining metallic layer.

3. The joining electrode according to claim 1, wherein said metallic covering layer includes a barrier metal.

4. The joining electrode according to claim 1, wherein said joining metallic layer is a material from the group consisting of copper, aluminum, and tungsten.

5. A semiconductor device comprising:
   the joining electrode according to claim 1;
   a semiconductor substrate in physical contact with a surface of the insulating layer,
   wherein said surface of the insulating layer is between said semiconductor substrate and said bottom surface of the trench.

* * * * *